United States Patent
Schrom et al.

(10) Patent No.: US 9,048,851 B2
(45) Date of Patent: Jun. 2, 2015

(54) SPREAD-SPECTRUM APPARATUS FOR VOLTAGE REGULATOR

(71) Applicants: Gerhard Schrom, Hillsboro, OR (US);
Alexander Lyakhov, Haifa (IL);
Michael W. Rogers, Hillsboro, OR (US); Dawson W. Kesling, Davis, CA (US); Jonathan P. Douglas, Portland, OR (US); J. Keith Hodgson, Hillsboro, OR (US)

(72) Inventors: Gerhard Schrom, Hillsboro, OR (US);
Alexander Lyakhov, Haifa (IL);
Michael W. Rogers, Hillsboro, OR (US); Dawson W. Kesling, Davis, CA (US); Jonathan P. Douglas, Portland, OR (US); J. Keith Hodgson, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 13/907,770

(22) Filed: May 31, 2013

(65) Prior Publication Data

US 2014/0269848 A1    Sep. 18, 2014

Related U.S. Application Data

(60) Provisional application No. 61/799,833, filed on Mar. 15, 2013.

(51) Int. Cl.
*H04L 7/00* (2006.01)
*H04B 1/00* (2006.01)
*H03L 7/189* (2006.01)

(52) U.S. Cl.
CPC .................... *H03L 7/189* (2013.01)

(58) Field of Classification Search
USPC .................... 375/354, 130, 371, 373
See application file for complete search history.

(56) References Cited

U.S. PATENT DOCUMENTS

| | | | |
|---|---|---|---|
| 5,631,920 A * | 5/1997 | Hardin | 375/130 |
| 8,699,642 B2 | 4/2014 | Skinner et al. | |
| 2006/0017512 A1* | 1/2006 | Huang | 331/17 |
| 2007/0096801 A1* | 5/2007 | Shimizu | 330/10 |
| 2011/0291730 A1* | 12/2011 | Ahn et al. | 327/276 |
| 2013/0093478 A1* | 4/2013 | Wong | 327/156 |
| 2014/0177752 A1 | 6/2014 | Kesling et al. | |
| 2014/0266119 A1 | 9/2014 | Burton et al. | |
| 2014/0266486 A1 | 9/2014 | Paillet et al. | |
| 2014/0266832 A1 | 9/2014 | Schrom et al. | |

FOREIGN PATENT DOCUMENTS

| | | |
|---|---|---|
| WO | WO-2013/048478 | 4/2013 |
| WO | WO-2013/101159 | 7/2013 |
| WO | WO-2013/147861 | 10/2013 |

* cited by examiner

*Primary Examiner* — Vineeta Panwalkar
(74) *Attorney, Agent, or Firm* — Blakely, Sokoloff, Taylor & Zafman LLP

(57) ABSTRACT

Described is an apparatus for providing spread-spectrum to a clock signal. The apparatus comprises: an oscillator to generate an output clock signal, the oscillator to receive an adjustable reference signal to adjust frequency of the output clock signal; a first circuit to provide a first signal indicative of a center frequency of the output clock signal; a second circuit to generate a switching waveform to provide spread-spectrum for the output clock signal; and a third circuit, coupled to the first and second circuits, to provide the adjustable reference signal according to the first signal and the switching waveform.

24 Claims, 9 Drawing Sheets

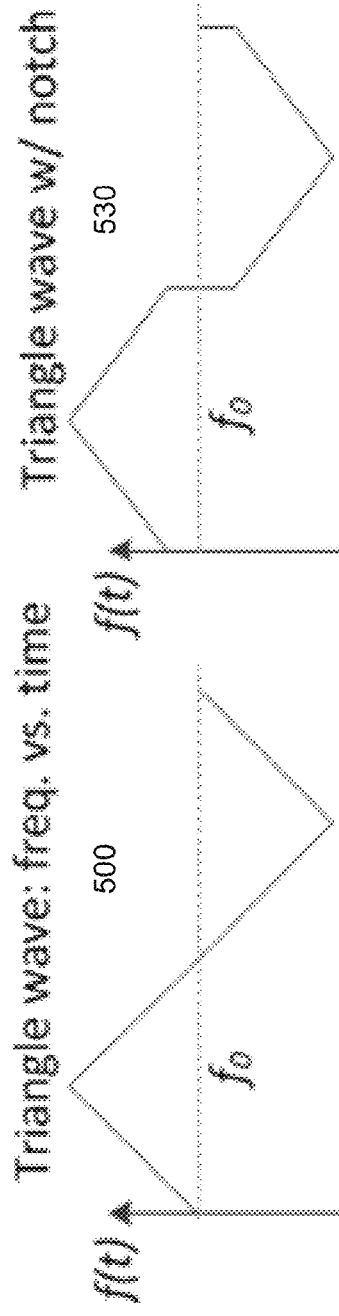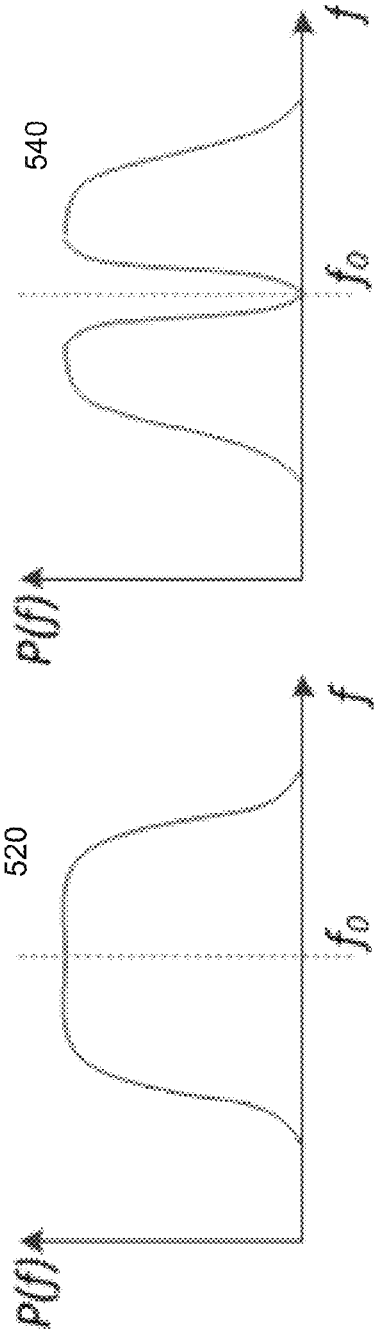

SPREAD-SPECTRUM APPARATUS FOR VOLTAGE REGULATOR

CLAIM OF PRIORITY

This application claims the benefit of priority of U.S. Provisional Application 61/799,833 filed Mar. 15, 2013, titled "Integrated Voltage Regulators," which is incorporated by reference in its entirety.

BACKGROUND

Noise from switching regulators can cause a part (e.g., processor) or platform to exceed EMI (electro-magnetic interference) specifications which may prevent the part or platform from being shipped or sold. Noise from switching regulators can also cause interference with a platform radio causing performance loss if the switching noise harmonics are present in the radio band. A typical solution to the above problem is to use Faraday cage shield for the switching voltage regulator. However, when switching voltage regulators are integrated on-die with other interfering circuits, Faraday cage may not be a viable solution.

Finite inductance and limited output decoupling capacitance in a buck DC-DC converter (e.g., Voltage Regulator) causes the output voltage of the converter to droop when output current suddenly increases. This can be a problem especially for the core supply (generated by the voltage regulator), with the highest di/dt. Voltage regulator (VR) may provide the supply for most voltage domains on a CPU (Central Processing Unit). The switching of high currents in a DC-DC converter at high di/dt may lead to electromagnetic emissions at the fundamental and at harmonics of the switching frequency, which cause electromagnetic interference (EMI) and radio frequency interference (RFI—seen by a receiving radio in the platform). Unmitigated EMI and RFI from the CPU can lead to increased platform cost and/or reduced battery life and can even cause the CPU to fail EMI testing.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

FIGS. 5A-D are plots showing operation of open loop spread-spectrum apparatus and closed-loop spread-spectrum apparatus with notch, according to one embodiment of the disclosure.

DETAILED DESCRIPTION

Figure 1:
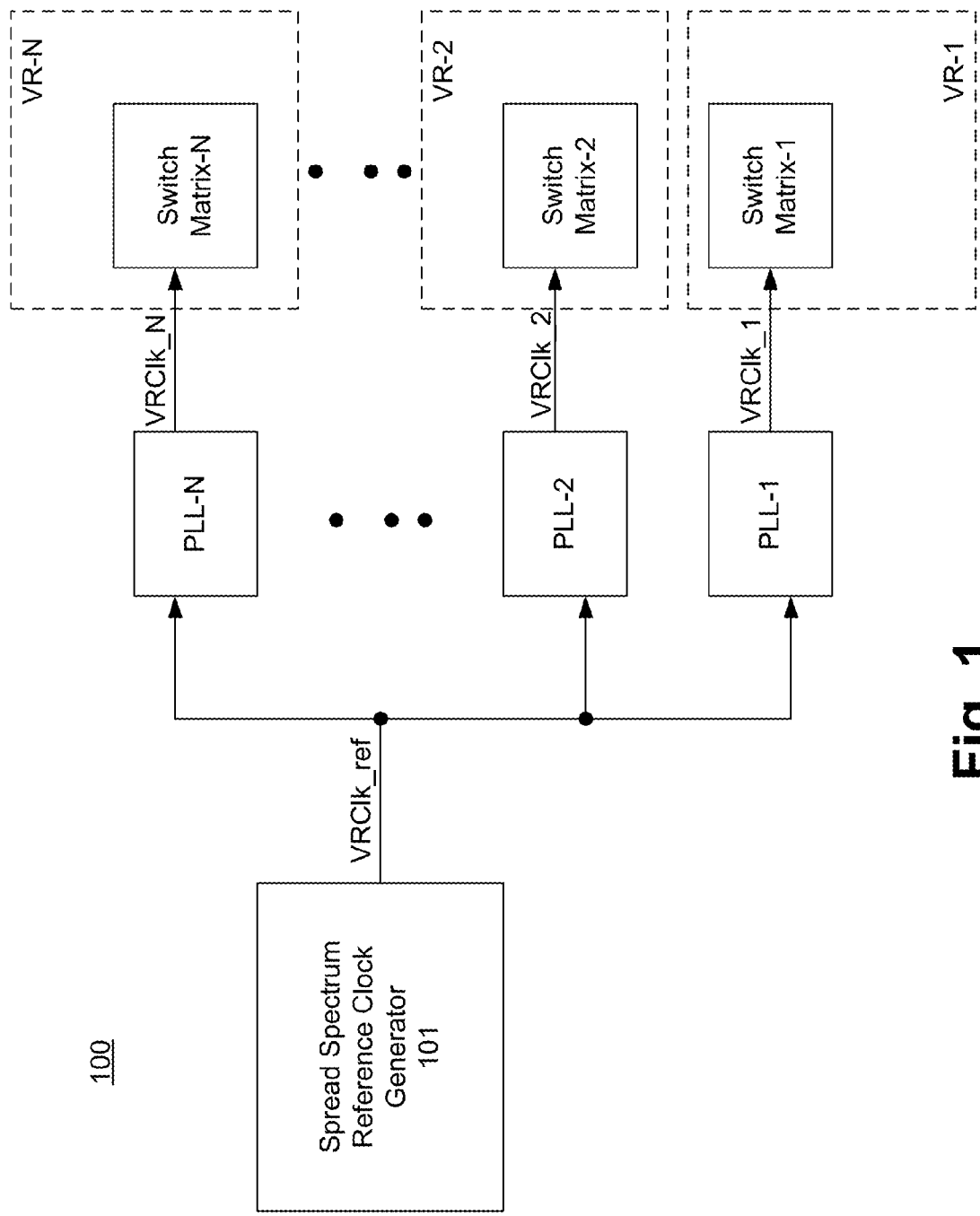
FIG. 1 is a high level architecture of using spread-spectrum for one or more switching voltage regulators, according to one embodiment of the disclosure.

The embodiments of the disclosure provide spread-spectrum modulation which reduces peak power spectral density to reduce EMI. In one embodiment, average switching frequency is adjusted to keep the spread harmonics away from the radios' receive band for RFI control. In one embodiment, a free running wide range oscillator (e.g., voltage controlled oscillator (VCO)) is used to provide the primary switching clock for the VR. In one embodiment, the VCO has a frequency tuning voltage that can be modulated to change the frequency.

In one embodiment, a slow speed digital tracking loop is used which uses a system reference clock and modulates the VCO voltage to keep the switching frequency stable to within a threshold e.g., 0.2-2%. In one embodiment, a software interface is used to allow the target switching frequency to be set to a specific value, which is used as the target frequency for the tracking loop. In one embodiment, in combination with the tracking loop, the software interface allows the switching frequency to be placed at a frequency spot where the harmonics interfere the least with the platform radios.

In one embodiment, a digital spread spectrum and notch filter block is used to modulate the tuning voltage of the VCO. In one embodiment, this digital logic works in combination with the tracking loop. In one embodiment, this digital block can provide traditional spread spectrum modulation for EMI mitigation, but in addition contains an algorithm that may create a notch in the frequency spectrum that is centered around the target switching frequency. In one embodiment, this notch is programmable in width and is used to reduce the noise at specific frequencies to below the threshold where radio interference can occur. In one embodiment, the above mentioned function is also programmable by software.

One technical effect of the embodiment is that it combines multiple digital algorithms and techniques to allow the platform to shape the VR noise spectrum to reduce radio interference and pass EMI certification. This allows the usage of higher frequency switching topologies and allows for reducing the usage of platform shielding. In addition, new VR circuits and topologies can be considered that might have been prohibited due to switching noise.

In one embodiment, digital algorithms for the spread spectrum and frequency notching produce an analog voltage that is mixed with the analog voltage from the frequency tracking loop. In one embodiment, the mixing of these analog voltages produces a VCO frequency with average frequency which equals the reference target frequency. In one embodiment, the instantaneous frequency is governed by the combined spread spectrum and frequency notching algorithm that determines where to shift the VCO frequency for providing the desired emissions profile.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct electrical connection between the things that are connected, without any intermediary devices. The term "coupled" means either a direct electrical connection between the things that are connected or an indirect connection through one or more passive or active intermediary devices. The term "circuit" means one or more passive and/or active components that are arranged to cooperate with one another to provide a desired function. The term "signal" means at least one current signal, voltage signal or data/clock signal. The meaning of "a," "an," and "the" include plural references. The meaning of "in" includes "in" and "on."

The term "scaling" generally refers to converting a design (schematic and layout) from one process technology to another process technology. The term "scaling" generally also refers to downsizing layout and devices within the same technology node. The term "scaling" may also refer to adjusting (e.g., slow down) of a signal frequency relative to another parameter, for example, power supply level. The terms "substantially," "close," "approximately," "near," and "about," generally refer to being within +/−20% of a target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For purposes of the embodiments, the transistors are metal oxide semiconductor (MOS) transistors, which include drain, source, gate, and bulk terminals. The transistors also include Tri-Gate and FinFet transistors, Gate All Around Cylindrical Transistors or other devices implementing transistor functionality like carbon nano tubes or spintronic devices. Source and drain terminals may be identical terminals and are interchangeably used herein. Those skilled in the art will appreciate that other transistors, for example, Bi-polar junction transistors—BJT PNP/NPN, BiCMOS, CMOS, eFET, etc., may be used without departing from the scope of the disclosure. The term "MN" indicates an n-type transistor (e.g., NMOS, NPN BJT, etc.) and the term "MP" indicates a p-type transistor (e.g., PMOS, PNP BJT, etc.).

FIG. 1 is a high level architecture 100 of using spread spectrum for one or more switching voltage regulators, according to one embodiment of the disclosure. In one embodiment, architecture 100 comprises Spread-Spectrum Reference Clock Generator 101, one or more phase locked loops (PLLs) i.e., PLL-1, PLL-2, and PLL-N, voltage regulators (VRs) i.e., VR-1, VR-2, and VR-N, where 'N' is an integer greater than 2. In one embodiment, each VR has its corresponding switch matrix i.e., Switch Matrix-1, Switch Matrix-2, and Switch Matrix-N, where 'N' is an integer greater than 2.

In one embodiment, Spread-Spectrum Reference Clock Generator 101 generates VRClk_ref for other clocking units associated with other voltage regulators. By spreading spectrum of the reference clock (VRClk_ref), other PLLs and respective oscillators of other voltage regulators (e.g., oscillators of pulse width modulators) that receive the reference clock effectively spread the spectrum of their clock signals to reduce EMI. In one embodiment, frequency of VRClk_ref is spread by +/−1% (e.g., 1 MHz to 100 MHz) to reduce peak power density (PPD), for example, by 20 times. In other embodiments, other percentage of spread may be used e.g., +/−3% at 3 KHz. In one embodiment, Spread-Spectrum Reference Clock Generator 101 is operable to spread spectrum of VRClk_ref by any percentage as long as VRs using the VRClk_Ref continue to work properly. For example, spectrum of VRClk_ref can be spread so that PLLs 1-N do not lose lock due to varying reference clock (VRClk_ref).

In one embodiment, several VRs's PWM are phase locked to the spread spectrum VRClk_ref. In one embodiment, the PWM operates at a frequency which is 2× the reference clock frequency (i.e., VRClk_ref). In one embodiment, customers or users of the VR can change the amount of spread and center frequency.

In one embodiment, Spread-Spectrum Reference Clock Generator 101 can introduce a notch in the spread harmonics to reduce radio frequency interference (RFI). For better radio communication, the receive band of the radio should not have noise. In one embodiment, gaps are introduced in the spectrum spread by the Spread-Spectrum Reference Clock Generator 101 to leave spectrum for radio to use in a noiseless (or substantially noiseless) fashion. In one embodiment, Spread-Spectrum Reference Clock Generator 101 keeps the average switching frequency (for spectrum spreading purposes) of the VRClk_ref constant. In one embodiment, Spread-Spectrum Reference Clock Generator 101 is operable to generate a triangular wave used for introducing up-spread and down-spread of spectrum. In one embodiment, Spread-Spectrum Reference Clock Generator 101 is operable to introduce random spectrum spread to VRClk_ref. For example, a random walk having a long controllable period is introduced to randomize the spectrum spread.

Figure 2:
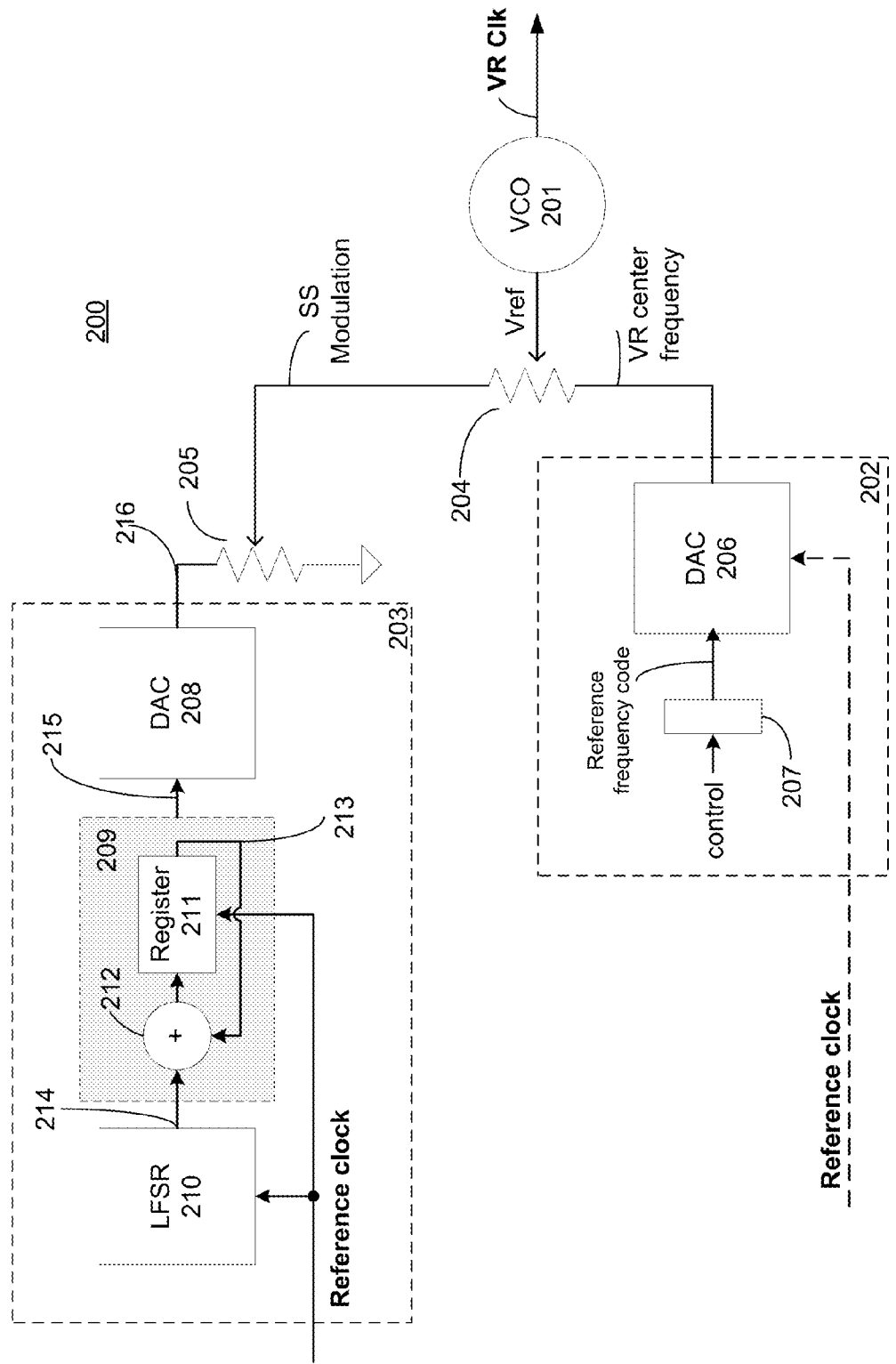
FIG. 2 is an open loop spread-spectrum apparatus, according to one embodiment of the disclosure.

FIG. 2 is an open loop spread spectrum apparatus 200 (e.g., 101), according to one embodiment of the disclosure. It is pointed out that those elements of FIG. 2 having the same reference numbers (or names) as the elements of any other figure can operate or function in any manner similar to that described, but are not limited to such.

In one embodiment, apparatus 200 comprises an oscillator 201, first circuit 202, second circuit 203, and third circuit 204. In one embodiment, oscillator 201 generates an output clock signal (VR Clk, which is same as VRClk_ref of FIG. 1) according to an adjustable reference signal (Vref) to adjust frequency of the output clock signal. In one embodiment, oscillator 201 is a digitally controlled oscillator (DCO), where the adjustable reference signal is a digital control word. In one embodiment, oscillator 201 is a voltage controlled oscillator (VCO), where the adjustable reference signal is a voltage control signal.

In one embodiment, first circuit 202 is operable to provide a first signal (e.g., VR center frequency) indicative of a center frequency of the output clock signal. In one embodiment, first circuit 202 comprises a first digital to analog converter (DAC) 206 to convert a digital representation (e.g., Reference frequency code) of the center frequency to an analog representation as the first signal (i.e., VR center frequency). In one embodiment, first circuit 202 comprises a register 207 coupled to DAC 206, where register 207 stores the Reference frequency code provided by control signal. In one embodiment, DAC 206 is a clocked DAC that operates using Reference clock signal. In one embodiment, DAC 208 is also a clocked DAC that operable using Reference clock signal. In other embodiments, DAC 206 and DAC 208 may be asynchronous.

In one embodiment, second circuit 203 is operable to generate a switching waveform 216 (e.g., SS modulation) to provide spectrum spread for the output clock signal. In one embodiment, second circuit 203 comprises a second DAC 208 and an up-down counter 209 operating at the Reference clock frequency. In one embodiment, second DAC 208 is coupled to up-down counter 209, where second DAC 208 is operable to generate the switching waveform 216 according to the output 215 of up-down counter 209. In one embodiment, second DAC 208 is a 12 bit DAC. In other embodiments, other sizes for second DAC 208 may be used. In one embodiment, larger bit sized DACs are used to generate a smoother output 216 so that Vref is modulated smoothly. In such an embodiment, VR Clk exhibits smooth spectrum spread so that follow on PLLs remain stable. In one embodiment, increasing DAC resolution (i.e., number of bits) helps reduce observability of spectral lines in the spread pattern.

In one embodiment, up-down counter 209 comprises register 211 coupled to an adder 212 such that output 213 of up-down counter 209 is added to current value from adder 212. In one embodiment, register 211 is a 12 bit register. In one embodiment, up-down counter 209 operates using Reference clock signal. In one embodiment, Reference clock signal has a frequency of 100 MHz. In other embodiments, other frequencies of Reference clock signal may be used. In one embodiment, up-down counter 209 is a free-running counter which switches direction of count when it overflows. In such an embodiment, output 215 of up-down counter 209 is a periodic triangular waveform. The frequency of Reference clock signal impacts the period of the triangular wave. In one embodiment, by increasing the counter size and resolution of DAC 208, greater maximum spread is achieved before spectral lines appear.

In one embodiment, second circuit 203 further comprises a pseudo-random generator 210 coupled to up-down counter 209. In one embodiment, pseudo-random generator 210 is operable to provide random up or down signals (also referred to as random walk signals) to up-down counter 209. In one embodiment, pseudo-random generator 210 is a linear feedback shift register (LFSR) which operates using Reference clock signal. In one embodiment, when pseudo-random generator 210 is enabled, output of 215 is a random-walk digital code. In one embodiment, up/dn signal 214 from pseudo-random generator 210 is random to the first order. In other embodiments, randomness of higher order may be introduced to up/dn signal 214 by pseudo-random generator 210.

In one embodiment, third circuit 204, coupled to the first and second circuits (202 and 203), provides the adjustable reference signal (Vref) according to the first signal (i.e., VR center frequency) and the switching waveform (either 216 or SS Modulation). So as not to obscure the embodiments, Vref is an analog voltage. In other embodiments, a digital control code may be generated for use by a DCO. In one embodiment, third circuit 204 is an on-die potentiometer (POT). In one embodiment, VR center frequency is fixed and SS modulation signal causes Vref to modulate. One such third circuit 204 is illustrated in FIG. 7.

Figure 7:
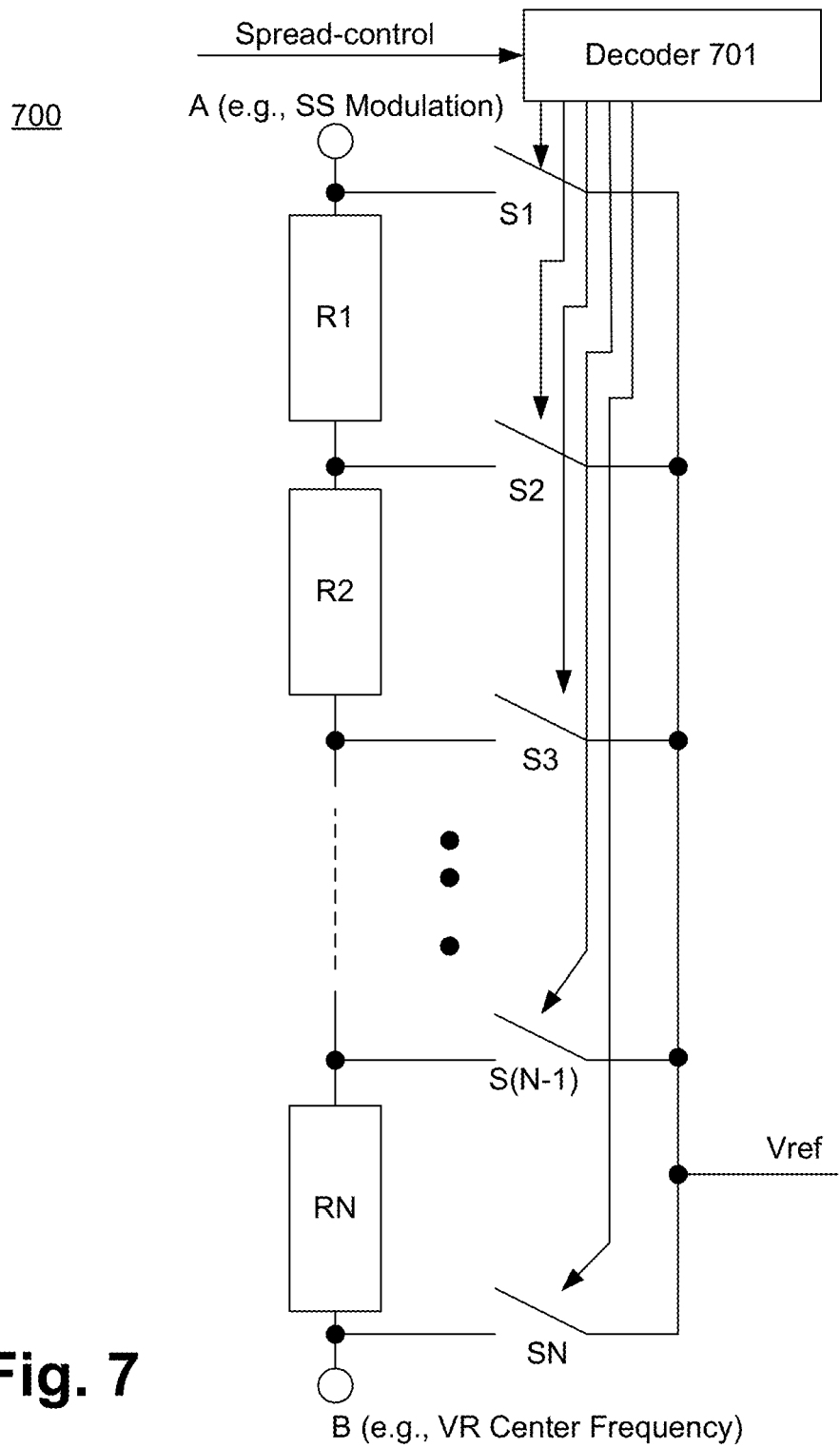
FIG. 7 is an adjustable resistor for use in the open and closed loop spread-spectrum apparatuses, according to one embodiment of the disclosure.

FIG. 7 is an adjustable resistor 700 (e.g., third circuit 204) used in the open and closed loop spread spectrum apparatuses, according to one embodiment of the disclosure. It is pointed out that those elements of FIG. 7 having the same reference numbers (or names) as the elements of any other figure can operate or function in any manner similar to that described, but are not limited to such.

In one embodiment, adjustable resistor 700 comprises a plurality of resistors R1-RN, where 'N' is an integer greater than 2. In one embodiment, resistors R1-RN are poly resistors. In other embodiments, R1-RN are transistors operating in linear mode. In one embodiment, R1-RN form a resistor ladder with a first terminal 'A' (e.g., providing SS Modulation signal) and a second terminal 'B' (e.g., providing VR Center Frequency). In one embodiment, adjustable resistor 700 interpolates with voltages or signals of first and second terminals.

In one embodiment, each terminal of the resistors is coupled to a controllable switch. For example, switches S1-SN are coupled to terminals of the resistors R1-RN as shown. In one embodiment, switches S1-SN are pass-gates formed from p-type devices, n-types devices, or combination of both. In one embodiment, switches S1-SN form a multiplexer to selectively couple an output of the resistor divider (i.e., resistors R1-RN) to provide the adjustable reference signal Vref.

In one embodiment, switches S1-SN are controllable by digital signals generated by Decoder 701. In one embodiment, Decoder 701 receives a Spread-control signal to determine what level of spread is desired. For example, Spread-control signal may indicate whether a spread of 1%, 2%, etc. is desired. In one embodiment, Spread-control signal is a fuse based signal. In another embodiment, Spread-control signal is programmable by software. In one embodiment, Decoder 701 generates signals to determine which switch is turned on and what switches are turned off to generate Vref.

Referring back to FIG. 2, in one embodiment, apparatus 200 further comprises fourth circuit 205 coupled to second and third circuits (203 and 204). In one embodiment, fourth circuit 205 is implemented digitally by inserting a digital scalar circuit between Counter 209 and DAC 208. In one embodiment, the digital scalar circuit may be implemented as a left/right-shift operation. In one embodiment, fourth circuit 205 scales signal on node 216 to generate SS Modulation signal which is then provided to third circuit 204. In one embodiment, fourth circuit 205 is an on-die POT (potentiometer). In one embodiment, fourth circuit 205 is implemented as adjustable resistor 700 of FIG. 7. In one embodiment, fourth circuit 205 provides an additional knob to control the amount of spread to spectrum of VR Clk.

Figure 4A:
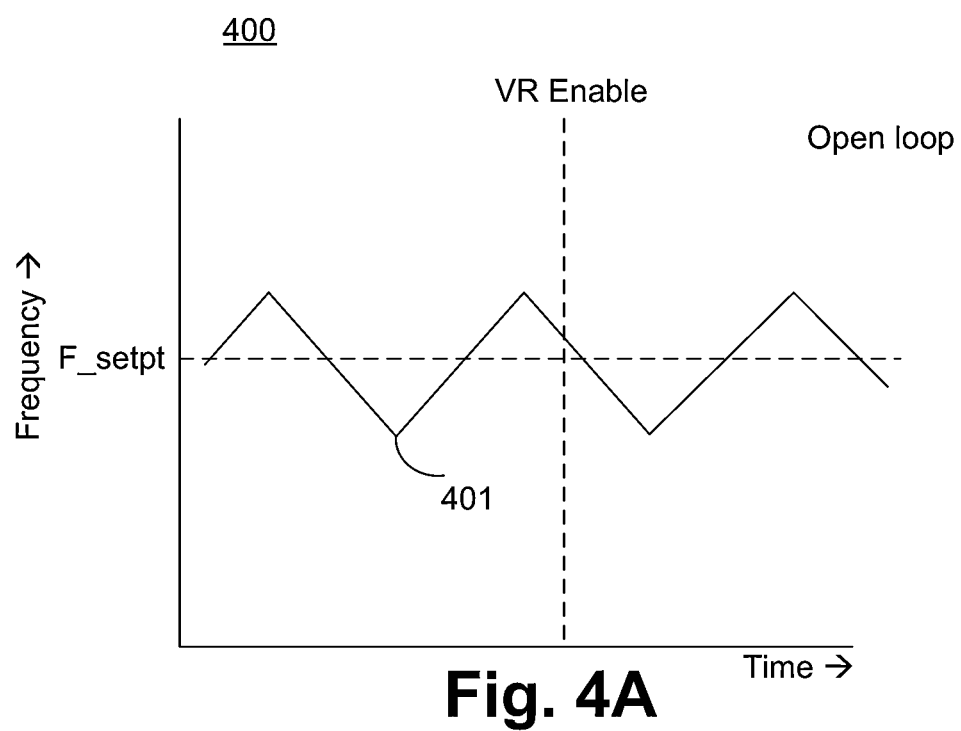
FIG. 4A is frequency plot showing operation of the open loop spread-spectrum apparatus, according to one embodiment of the disclosure.

FIG. 4A is plot 400 showing operation of the open loop spread spectrum apparatus 200 of FIG. 2 in slow locking mode, according to one embodiment of the disclosure. It is pointed out that those elements of FIG. 4A having the same reference numbers (or names) as the elements of any other figure can operate or function in any manner similar to that described, but are not limited to such.

The x-axis is time and the y-axis is frequency. The dashed horizontal line indicates the target spread frequency i.e., F_setpt. The vertical dashed line indicates the time when VRs (e.g., VRs 1-N) are enabled. In open-loop mode, spread can turn on immediately as shown by triangular wave 401 but there may be error between the frequency set point (i.e., F_setpt) and actual operating frequency.

Figure 3:
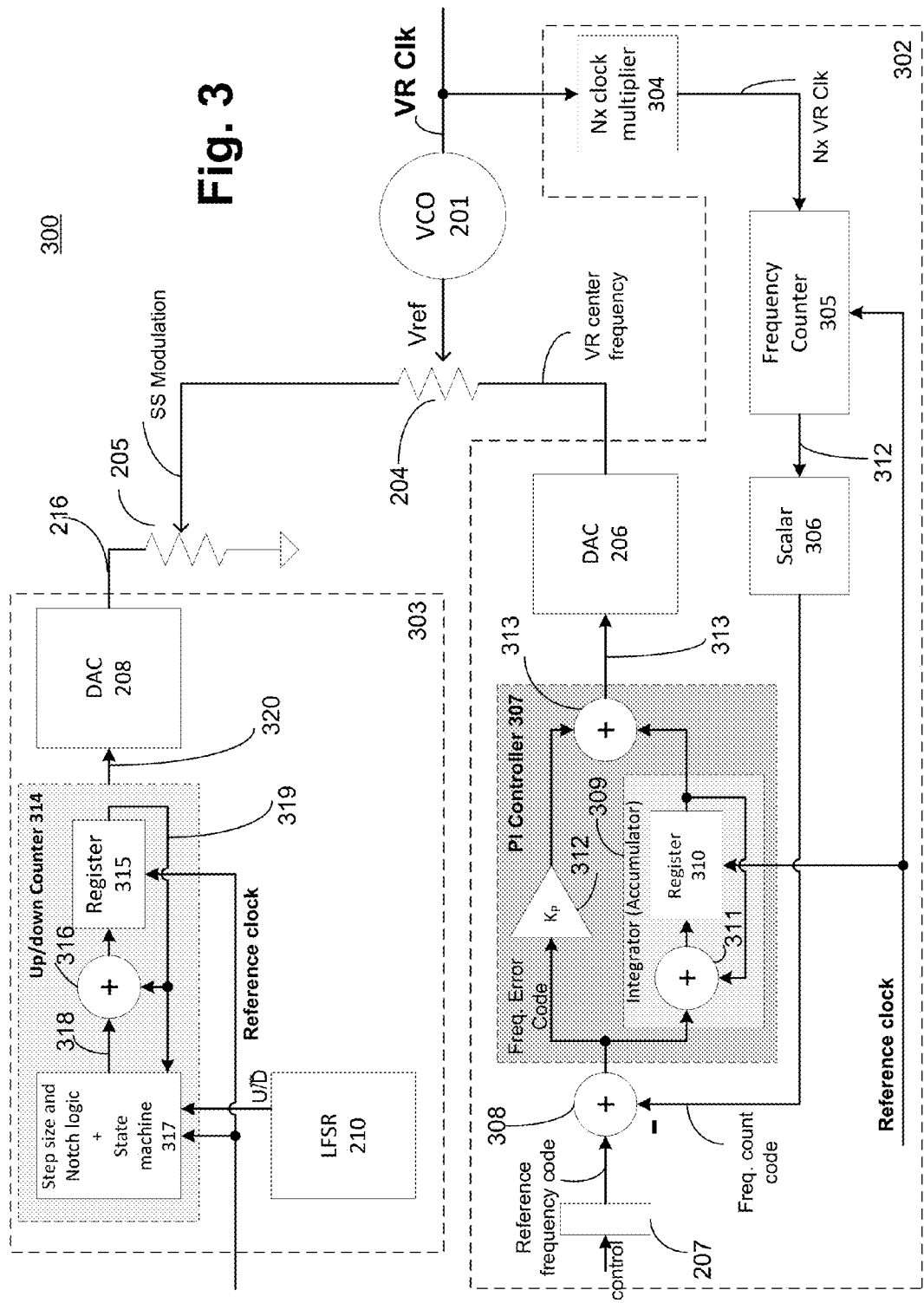
FIG. 3 is a closed loop spread-spectrum apparatus with variable tracking of output clock and notch capability, according to one embodiment of the disclosure.

FIG. 3 is a closed loop spread-spectrum apparatus 300 with variable tracking and notch capability, according to one embodiment of the disclosure. It is pointed out that those elements of FIG. 3 having the same reference numbers (or names) as the elements of any other figure can operate or function in any manner similar to that described, but are not limited to such. So as not to obscure the embodiments, components and/or features previously discussed with the same identifiers are not discussed again.

In one embodiment, apparatus 300 comprises oscillator 201, first circuit 302, second circuit 303, and third circuit 204. In one embodiment, oscillator 201 is a free running wide range oscillator that provides the primary switching clock for the integrated voltage regulator. In one embodiment, oscillator 201 has a frequency tuning voltage (when oscillator 201 is a VCO) or digital code (when oscillator 201 is a DCO) that can modulate to change the frequency of VR Clk. So as not to obscure the embodiment, oscillator 201 is a VCO. The same concepts apply to DCO (not shown). In one embodiment, apparatus 300 operates in slow speed digital tracking loop that uses a system reference clock and modulates VCO 201 voltage to keep the switching frequency stable to within a tight percentage, for example, 0.2%.

In one embodiment, first circuit 302 provides a tracking loop and first signal (i.e., VR center frequency) indicative of a center frequency of the output clock signal (i.e., VR Clk). In one embodiment, first circuit 302 provides a fast tracking mode so that spread target frequency is achieved well before VRs (e.g., VRs 1-N) are enabled. In one embodiment, first circuit 302 comprises a multiplier 304 to multiple frequency of VR Clk by an integer multiple 'N.'

One technical effect of multiplying frequency of VR Clk is to achieve fast tracking of VR Clk frequency i.e., fast adjustment of VR Clk center frequency to reach a desired target frequency. During regular mode, i.e., non-fast tracking mode (e.g., slow tracking mode), the multiplying factor is one. In such an embodiment, multiplier 304 is operable to cause the output clock signal frequency to remain unchanged for use by first circuit 302 when first circuit 302 is operable to operate in a slow tracking mode different from the fast tracking mode.

Figure 6A:
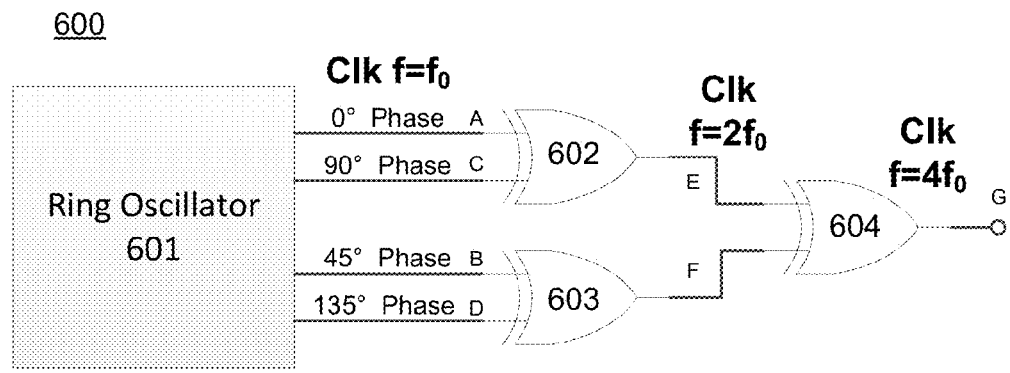
FIG. 6A shows a multiplier for use in the closed loop spread-spectrum apparatus, according to one embodiment of the disclosure.

FIG. 6A shows a multiplier 600 (e.g., 304) for use in the closed loop spread spectrum apparatus 300, according to one embodiment of the disclosure. It is pointed out that those elements of FIG. 6A having the same reference numbers (or names) as the elements of any other figure can operate or function in any manner similar to that described, but are not limited to such.

In one embodiment, multiplier 600 comprises ring oscillator 601, and Exclusive OR logic (XOR) gates 602, 603, and 604. In one embodiment, ring oscillator 601 comprises a chain of delay stages coupled together to form a ring. In one embodiment, ring oscillator 601 is a VCO (like VCO 201). In one embodiment, ring oscillator is a DCO controllable by a digital control word. In one embodiment, each delay stage is an inverting stage. In one embodiment, outputs of each delay stage of ring oscillator 601 are 45 degree out of phase with reference to each other. In one embodiment, inputs A and C of XOR logic gate 602 are 0 and 90 degrees out of phase, respectively. In one embodiment, inputs B and D of XOR logic 603 are 45 and 135 degrees out of phase, respectively. In one embodiment, frequency of signals on inputs A, B, C, and D is $f_0$.

In one embodiment, outputs of XOR 602 and 603 form inputs E and F for XOR 604. In this embodiment, frequency of signals on inputs E and F are twice the frequency of $f_0$ i.e., $2f_0$. In one embodiment, output G of XOR 604 is twice the frequency of frequencies of signals on inputs E and F, i.e., $4f_0$.

Figure 6B:
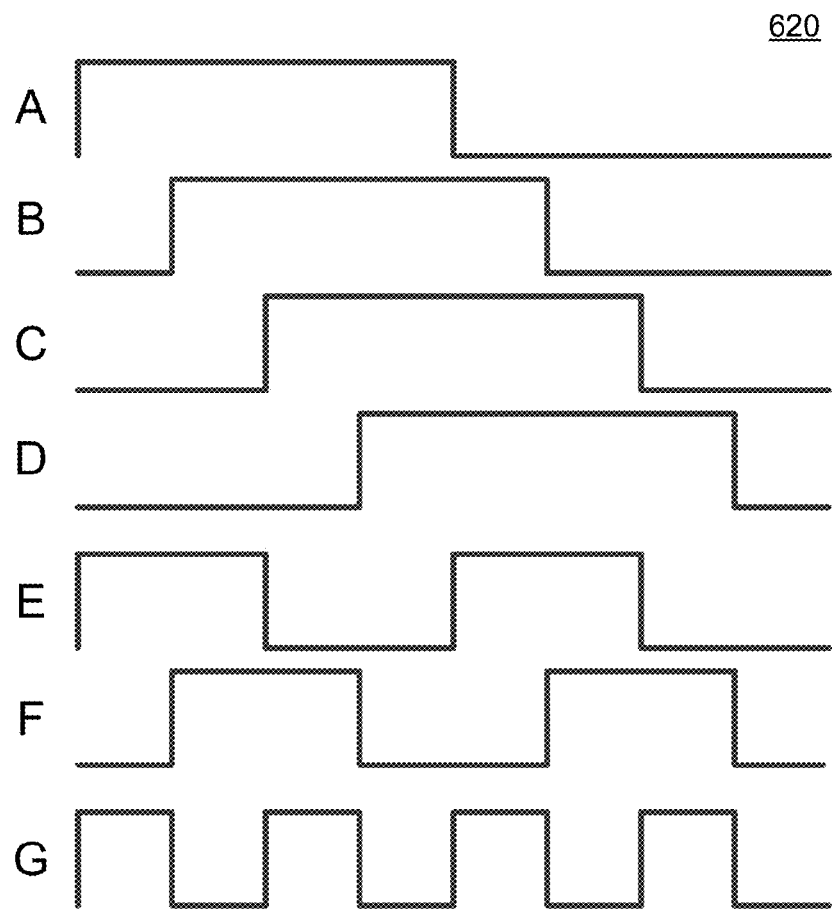
FIG. 6B are waveforms showing operation of the multiplier, according to one embodiment of the disclosure.

FIG. 6B are waveforms 620 showing operation of multiplier 600, according to one embodiment of the disclosure. It is pointed out that those elements of FIG. 6A having the same reference numbers (or names) as the elements of any other figure can operate or function in any manner similar to that described, but are not limited to such. Plot 620 shows waveforms A, B, C, D, E, F, and G which are discussed with reference to FIG. 6A. Frequency of signal G is four times the frequency of signal A.

Referring back to FIG. 3, in one embodiment, first circuit 302 comprises frequency counter 305 to count frequency of output clock signal VR Clk relative to Reference clock signal. In one embodiment, frequency counter 305 counts the multiplied clock i.e., VR Clk×N, where 'N' is an integer one or greater. In one embodiment, frequency count 312 is stored as a frequency count code. In one embodiment, frequency counter 305 is a 16 bit counter. In other embodiments, other sizes for frequency counter 305 may be used.

In one embodiment, first circuit 302 comprises logic unit 306 (also referred to as Scalar) to scale the frequency count 312 by a scaled amount. For example, during fast tracking mode when multiplier 304 multiples VR Clk by an integer multiple 'N,' the frequency count 312 is scaled by the same amount as multiple 'N.' In one embodiment, during normal mode (e.g., slow tracking mode), the scale factor is '1' for Scalar 306. In one embodiment, Scalar 306 is bypassed during normal mode. In one embodiment, output of Scalar 306 is the frequency count code. In one embodiment, Scalar 306 is a 10 bit scalar. In other embodiments, other size for Scalar 306 may be used. In one embodiment, first circuit 302 further comprises logic 308 (i.e., adder) to subtract the frequency count code from a Reference frequency code (same as target frequency code) to generate a frequency error code. In one embodiment, frequency error code indicates how far the current spread frequency is from the target spread frequency.

In one embodiment, first circuit 302 further comprises Proportional Integrator (PI) controller 307 that generates a digital version of center frequency as signal 313. In one embodiment, first DAC 206 receives the digital version of center frequency 313 and generates an analog version VR center frequency. In one embodiment, a software interface is provided to allow the target switching frequency (i.e., Reference frequency code) to be set to a specific value that is used as the target frequency for the tracking loop. In one embodiment, the tracking loop is formed of multiplier 304, frequency counter 305, scalar 306, adder 308, PI controller 307, DAC 206 third circuit 204, and VCO 201. One technical effect of the tracking loop is that it allows the switching frequency to be placed at a frequency spot where the harmonics interfere the least with the platform radios.

In one embodiment, PI controller 307 comprises an integrator (also referred to as Accumulator) 309. In one embodiment, integrator 309 comprises a counter having register 310 coupled to adder 311 as shown. One technical effect of integrator 309 is to accumulate error over time so that average frequency error reduces to zero even after accounting for factors such as temperature drift in the VCO or offset due to another component in the system.

In one embodiment, PI controller 307 comprises a gain unit 312 with gain $K_p$ which is the proportional feedback gain. In one embodiment, PI controller 307 comprises an adder 313 to add the output of integrator 309 (also referred to as accumulator) with the output of gain unit 312 to generate average center frequency. In one embodiment, the proportional component dictates how strongly controller 307 reacts to present error. This helps dictate the speed at which controller 307 can settle to zero error (in this case, average frequency error), and also plays a role in system stability, i.e. setting $K_P$ gain too high can cause the system to be unstable while setting $K_P$ too low will cause the system to settle too slowly.

In one embodiment, second circuit 303 is operable to generate a switching waveform (216 or SS Modulation signal). Second circuit 303 is different from second circuit 203 of FIG. 2 in that second circuit 303 is operable to cause a notch in a spectrum of the output clock signal VR Clk. In one embodiment, second circuit 303 comprises an up-down Counter 314 operating at a reference clock frequency. In one embodiment, up-down Counter 314 generates a triangular wave using up-down counter 209. In one embodiment, the rising section of the triangular wave results in up spectrum spread while the falling section of the triangular wave results in down spectrum spread.

In one embodiment, up-down Counter 314 comprises register 315 coupled to adder 316 such that output of register 319 is added by adder 316. In one embodiment, second circuit 303 comprises notch logic 317 to cause a notch in an output 320 of the up-down Counter 314. In one embodiment, output 318 of notch logic 317 is added to output 319 of register 315 by adder 316. In one embodiment, a finite state machine (FSM) (also shown as part of 317) controls notch logic.

In one embodiment, the FSM uses the current value of the up/dn counter output 319 to determine the step size and direction (up or down) of the next count. In one embodiment, the step size is determined by configurable notch width setting such that the output steps the correct amount depending on the current position of the waveform. In one embodiment, the frequency of the triangle wave can be adjusted by changing the step size. In one embodiment, the FSM detects high/low overflow of the current or next state to determine when to reverse direction.

In one embodiment, second circuit 303 comprises pseudo-random generator 210 that randomizes the up/down (U/D) signal. In one embodiment, second circuit 303 comprises second DAC 208 coupled to up-down counter 314. In one embodiment, output 320 which is either periodic triangular wave or random walk signal is converted into analog signal 216 by DAC 208.

In one embodiment, third circuit 204 (e.g., adjustable resistor 700 of FIG. 7), coupled to first and second circuits 302 and 303, provides the adjustable reference signal Vref according to the center frequency of the output clock signal VR Clk and the switching waveform (216 or SS Modulation signal).

In one embodiment, digital spread spectrum and notch filter modulates the tuning signal Vref of oscillator 201. In one embodiment, the digital logic works in combination with the tracking loop. In one embodiment, output of second circuit 303 (like output of second circuit 203 of FIG. 2) provides spread spectrum modulation for EMI mitigation, but in addition generates a notch in the frequency spectrum that is centered around the target switching frequency. In one embodiment, notch logic 317 is programmable in notch width and is used to reduce the noise at specific frequencies to below the threshold where radio interference can occur. In one embodiment, notch logic 317 is programmable by software.

One technical effect of apparatus 300 is that it combines multiple digital algorithms and techniques to allow the platform to shape the integrated voltage regulator noise spectrum to reduce radio interference and pass EMI certification. The embodiments allow the usage of higher frequency switching circuit topologies and also allows for reducing the usage of platform shielding.

In one embodiment, digital algorithms for spreading spectrum and frequency notching produce a control signal (e.g., 216) that is mixed with output (e.g., VR center frequency) from frequency tracking loop. In one embodiment, the mixing of signals (e.g., VR center frequency signal and SS Modulation signal) produces an oscillator frequency (of oscillator 201) having average frequency substantially equal to the reference target frequency. In one embodiment, instantaneous frequency is governed by the combined spreading spectrum and frequency notching algorithms that determine where to shift the frequency of oscillator 201 for providing desired emissions profile.

Figure 4B:
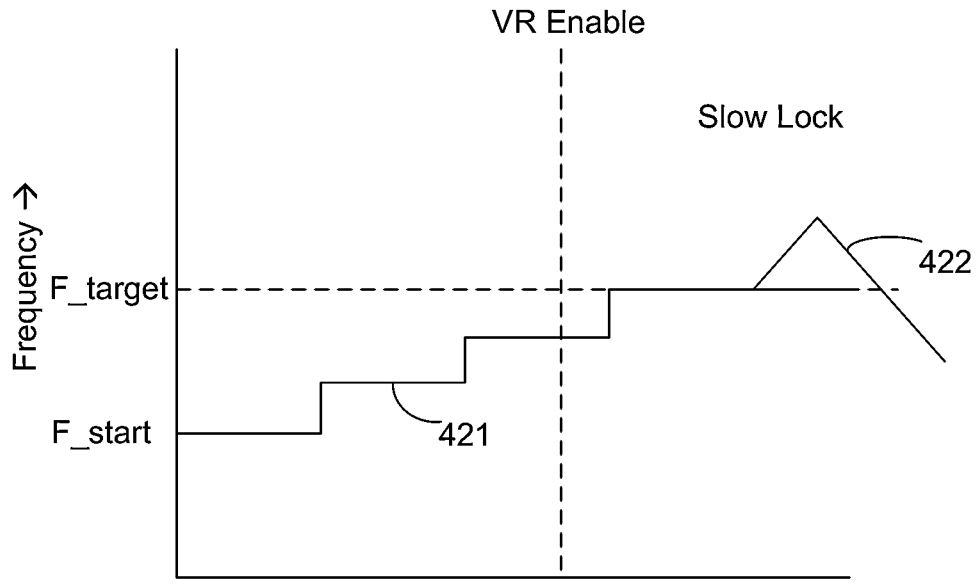
FIG. 4B is frequency plot showing operation of the closed loop spread-spectrum apparatus with slow locking, according to one embodiment of the disclosure.

FIG. 4B is plot 420 showing operation of the closed loop spread spectrum apparatus 300 of FIG. 3 in slow locking mode, according to one embodiment of the disclosure. It is pointed out that those elements of FIG. 4B having the same reference numbers (or names) as the elements of any other figure can operate or function in any manner similar to that described, but are not limited to such.

The x-axis is time and the y-axis is frequency. The dashed horizontal line indicates the target spread frequency i.e., F_target. The staircase waveform 421 begins from a start frequency i.e., F_start, and ends when F_target is achieved. At that point, triangular wave 422 spreads the spectrum. The vertical dashed line indicates the time when VRs (e.g., VRs 1-N) are enabled.

Figure 4C:
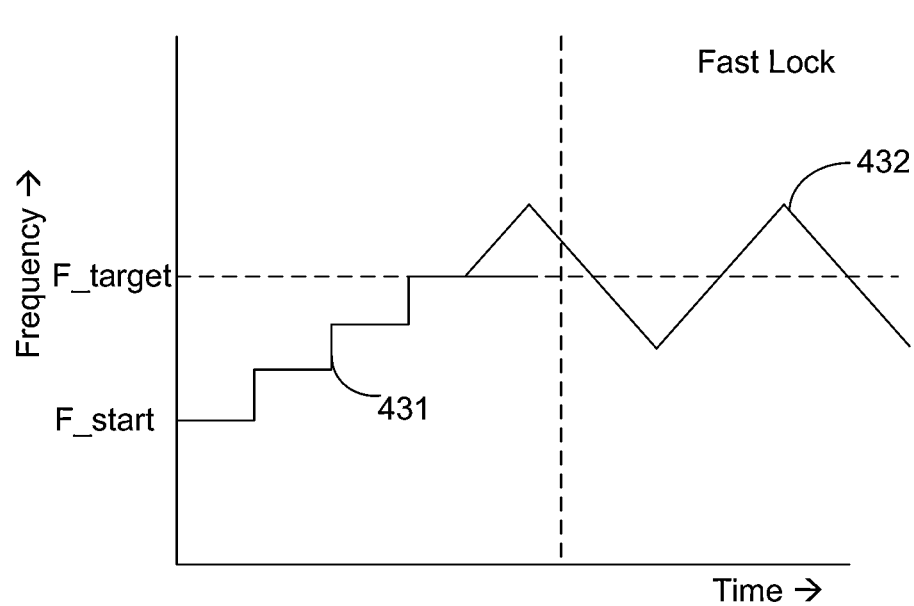
FIG. 4C is a frequency plot showing operation of the closed loop spread-spectrum apparatus, according to one embodiment of the disclosure.

FIG. 4C is plot 430 showing operation of the closed loop spread spectrum apparatus 300 of FIG. 3 in fast locking mode, according to one embodiment of the disclosure. It is pointed out that those elements of FIG. 4C having the same reference numbers (or names) as the elements of any other figure can operate or function in any manner similar to that described, but are not limited to such.

The x-axis is time and the y-axis is frequency. The dashed horizontal line indicates the target spread frequency i.e., F_target. The staircase waveform 431 begins from a start frequency i.e., F_start, and ends when F_target is achieved. Compared to waveform 421 of FIG. 4B, waveform 431 reaches the target frequency faster because of the fast track mode in which VR Clk is multiplied by Multiplier 304, and Scalar 306 scales the output 312 of Frequency counter 305. The vertical dashed line indicates the time when VRs (e.g., VRs 1-N) are enabled. With apparatus 300, spectrum of VR Clk is already spread before the VRs are enabled.

FIGS. 5A-D are plots showing operation of open loop spread spectrum apparatus 200 of FIG. 2 and closed-loop spread-spectrum apparatus 300 of FIG. 3 with notch, according to one embodiment of the disclosure. It is pointed out that those elements of FIGS. 5A-D having the same reference numbers (or names) as the elements of any other figure can operate or function in any manner similar to that described, but are not limited to such.

FIG. 5A is plot 500 with x-axis as time and y-axis as frequency. Plot 500 shows triangle wave at node 216 of FIG. 2. Here, $f_0$ indicates the center frequency (i.e., VR center frequency generated by first circuit 202). FIG. 5B is plot 520 with x-axis as frequency and y-axis as power. Plot 520 shows power spectrum spread around center frequency $f_0$ as generated by apparatus 200 and/or 300.

FIG. 5C is plot 530 with x-axis as time and y-axis as frequency. Plot 500 shows triangle wave at node 216 of FIG. 3 with notch. Here, $f_0$ indicates the center frequency (i.e., VR center frequency generated by first circuit 302). FIG. 5D is plot 540 with x-axis as frequency and y-axis as power. Plot 540 shows notched power spectrum spread around center frequency $f_0$ as generated by apparatus 300. In one embodiment, the notch at center frequency $f_0$ reduces EMI/RFI for radio signals operating in region around $f_0$ or harmonics $N \times f_0$, where 'N' is an integer greater than 'N.'

Figure 8:
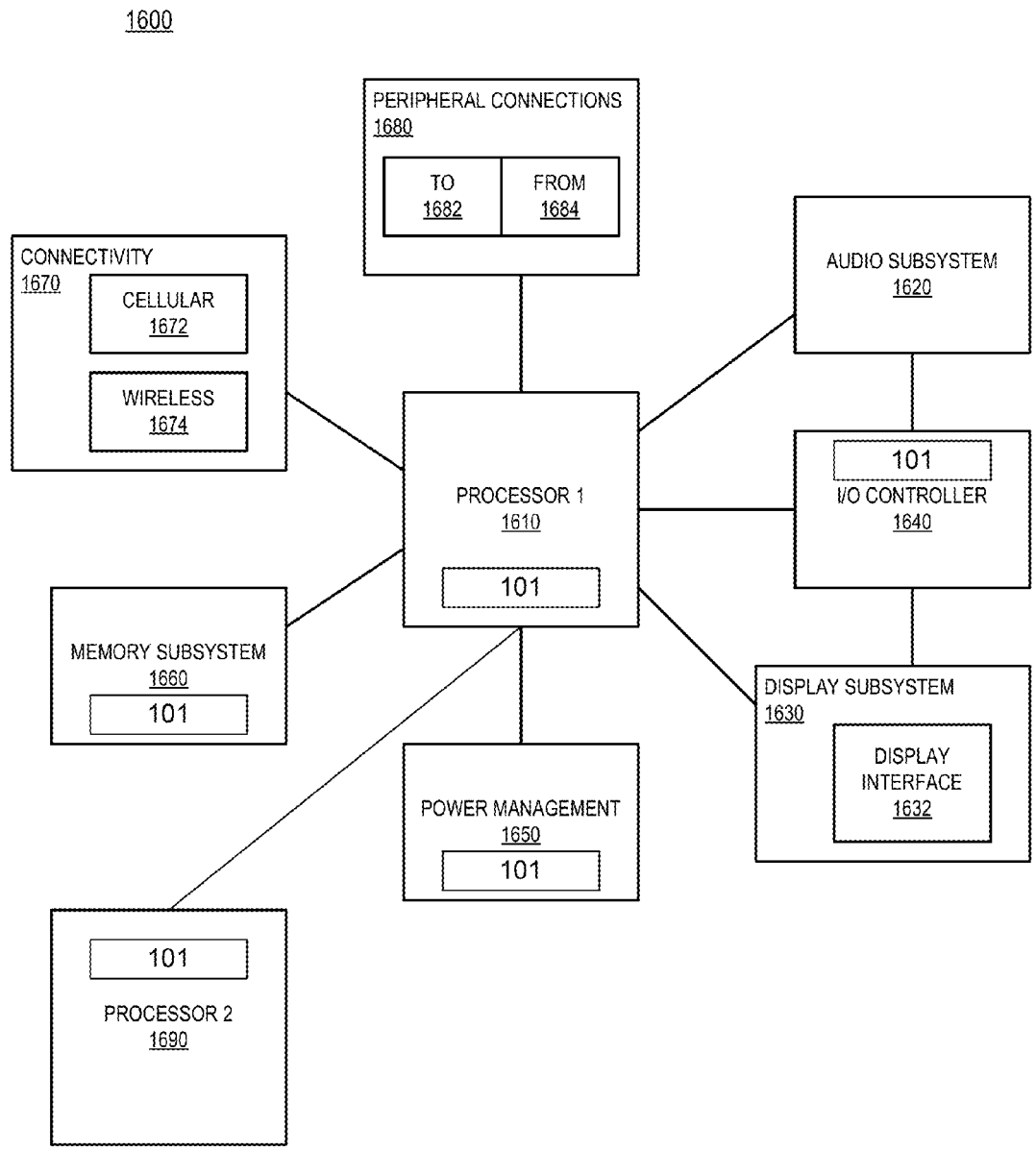
FIG. 8 is a smart device or a computer system or an SoC (system-on-chip) with the spread-spectrum apparatus for switching voltage regulators, according to one embodiment of the disclosure.

FIG. 8 is a smart device or a computer system 1600 or an SoC (system-on-chip) with the spread spectrum apparatus 101 (e.g., 200 and/or 300) for switching voltage regulators, according to one embodiment of the disclosure. It is pointed out that those elements of FIG. 8 having the same reference numbers (or names) as the elements of any other figure can operate or function in any manner similar to that described, but are not limited to such.

FIG. 8 illustrates a block diagram of an embodiment of a mobile device in which flat surface interface connectors could be used. In one embodiment, computing device 1600 represents a mobile computing device, such as a computing tablet, a mobile phone or smart-phone, a wireless-enabled e-reader, or other wireless mobile device. It will be understood that certain components are shown generally, and not all components of such a device are shown in computing device 1600.

In one embodiment, computing device 1600 includes a first processor 1610 with spread-spectrum 101, according to the embodiments discussed. Other blocks of the computing device 1600 may also include spread-spectrum 101. The various embodiments of the present disclosure may also comprise a network interface within 1670 such as a wireless interface so that a system embodiment may be incorporated into a wireless device, for example, cell phone or personal digital assistant.

In one embodiment, processor 1610 (and processor 1690) can include one or more physical devices, such as microprocessors, application processors, microcontrollers, programmable logic devices, or other processing means. The processing operations performed by processor 1610 include the execution of an operating platform or operating system on which applications and/or device functions are executed. The processing operations include operations related to I/O (input/output) with a human user or with other devices, operations related to power management, and/or operations related to connecting the computing device 1600 to another device. The processing operations may also include operations related to audio I/O and/or display I/O.

In one embodiment, computing device 1600 includes audio subsystem 1620, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 1600, or connected to the computing device 1600. In one embodiment, a user interacts with the computing device 1600 by providing audio commands that are received and processed by processor 1610.

Display subsystem 1630 represents hardware (e.g., display devices) and software (e.g., drivers) components that provide a visual and/or tactile display for a user to interact with the computing device 1600. Display subsystem 1630 includes display interface 1632, which includes the particular screen or hardware device used to provide a display to a user. In one embodiment, display interface 1632 includes logic separate from processor 1610 to perform at least some processing related to the display. In one embodiment, display subsystem 1630 includes a touch screen (or touch pad) device that provides both output and input to a user.

I/O controller 1640 represents hardware devices and software components related to interaction with a user. I/O controller 1640 is operable to manage hardware that is part of audio subsystem 1620 and/or display subsystem 1630. Additionally, I/O controller 1640 illustrates a connection point for additional devices that connect to computing device 1600 through which a user might interact with the system. For example, devices that can be attached to the computing device 1600 might include microphone devices, speaker or stereo systems, video systems or other display devices, keyboard or keypad devices, or other I/O devices for use with specific applications such as card readers or other devices.

As mentioned above, I/O controller 1640 can interact with audio subsystem 1620 and/or display subsystem 1630. For example, input through a microphone or other audio device can provide input or commands for one or more applications or functions of the computing device 1600. Additionally, audio output can be provided instead of, or in addition to display output. In another example, if display subsystem 1630 includes a touch screen, the display device also acts as an input device, which can be at least partially managed by I/O controller 1640. There can also be additional buttons or switches on the computing device 1600 to provide I/O functions managed by I/O controller 1640.

In one embodiment, I/O controller 1640 manages devices such as accelerometers, cameras, light sensors or other environmental sensors, or other hardware that can be included in the computing device 1600. The input can be part of direct user interaction, as well as providing environmental input to the system to influence its operations (such as filtering for noise, adjusting displays for brightness detection, applying a flash for a camera, or other features).

In one embodiment, computing device 1600 includes power management 1650 that manages battery power usage, charging of the battery, and features related to power saving operation. Memory subsystem 1660 includes memory devices for storing information in computing device 1600. Memory can include nonvolatile (state does not change if power to the memory device is interrupted) and/or volatile (state is indeterminate if power to the memory device is interrupted) memory devices. Memory subsystem 1660 can store application data, user data, music, photos, documents, or other data, as well as system data (whether long-term or temporary) related to the execution of the applications and functions of the computing device 1600.

Elements of embodiments are also provided as a machine-readable medium (e.g., memory 1660) for storing the computer-executable instructions (e.g., instructions to implement any other processes discussed herein). The machine-readable medium (e.g., memory 1660) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 1670 includes hardware devices (e.g., wireless and/or wired connectors and communication hardware) and software components (e.g., drivers, protocol stacks) to enable the computing device 1600 to communicate with external devices. The computing device 1600 could be separate devices, such as other computing devices, wireless access points or base stations, as well as peripherals such as headsets, printers, or other devices.

Connectivity 1670 can include multiple different types of connectivity. To generalize, the computing device 1600 is illustrated with cellular connectivity 1672 and wireless connectivity 1674. Cellular connectivity 1672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 1674 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 1680 include hardware interfaces and connectors, as well as software components (e.g., drivers, protocol stacks) to make peripheral connections. It will be understood that the computing device 1600 could both be a peripheral device ("to" 1682) to other computing devices, as well as have peripheral devices ("from" 1684) connected to it. The computing device 1600 commonly has a "docking" connector to connect to other computing devices for purposes such as managing (e.g., downloading and/or uploading, changing, synchronizing) content on computing device 1600. Additionally, a docking connector can allow computing device 1600 to connect to certain peripherals that allow the computing device 1600 to control content output, for example, to audiovisual or other systems.

In addition to a proprietary docking connector or other proprietary connection hardware, the computing device 1600 can make peripheral connections 1680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. For example, other memory architectures e.g., Dynamic RAM (DRAM) may use the embodiments discussed. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

For example, apparatus comprises: an oscillator to generate an output clock signal, the oscillator to receive an adjustable reference signal to adjust frequency of the output clock signal; a first circuit to provide a first signal indicative of a center frequency of the output clock signal; a second circuit to generate a switching waveform to provide spread-spectrum for the output clock signal; and a third circuit, coupled to the first and second circuits, to provide the adjustable reference signal according to the first signal and the switching waveform.

In one embodiment, the oscillator is one of a VCO or a DCO. In one embodiment, the first circuit comprises a first DAC to convert a digital representation of the center frequency to an analog representation as the first signal. In one embodiment, the second circuit comprises: an up-down counter operating at a reference clock frequency; and a second DAC coupled to the up-down counter, the second DAC to generate the switching waveform. In one embodiment, the apparatus further comprises a pseudo-random generator coupled to the up-down counter, the pseudo-random generator to provide up or down signals to the up-down counter. In one embodiment, the up-down counter to generate a triangular waveform for the second DAC. In one embodiment, the up-down counter to generate a random walk signal for the second DAC.

In one embodiment, the third circuit comprises: a resistor divider; and a multiplexer to selectively couple an output of the resistor divider to provide the adjustable reference signal. In one embodiment, the apparatus further comprises a fourth circuit coupled to the second circuit and the third circuit, the fourth circuit including: a resistor divider; and a multiplexer to selectively couple an output of the resistor divider to provide the switching waveform. In one embodiment, the apparatus further comprises a PWM to receive the output clock signal. In one embodiment, the oscillator is a replica oscillator of a PWM oscillator.

In another example, an apparatus comprises: an oscillator to generate an output clock signal, the oscillator to receive an adjustable reference signal to adjust frequency of the output clock signal; a first circuit to provide a first signal indicative of a center frequency of the output clock signal; a second circuit to generate a switching waveform, the second circuit operable to cause a notch in a spectrum of the output clock signal; and a third circuit, coupled to the first and second circuits, to provide the adjustable reference signal according to the center frequency of the output clock signal and the switching waveform.

In one embodiment, the first circuit comprises: a frequency counter to count frequency of output clock signal relative to a reference clock signal, the frequency count stored as a frequency code; and a logic unit to subtract the frequency code from a reference frequency code to generate a frequency error code. In one embodiment, the first circuit further comprises a clock multiplier which is operable to multiply frequency of the output clock signal, the clock multiplier coupled to the frequency counter.

In one embodiment, the clock multiplier is operable to multiply frequency of the output clock signal by a factor greater than one when the first circuit is operable to operate in a fast track mode, and to cause the output clock signal frequency to remain unchanged when the first circuit is operable to operate in a slow track mode different from the fast track mode. In one embodiment, the first circuit further comprises a frequency scalar to scale the frequency count by a factor greater than one when the first circuit is operable to operate in a fast track mode. In one embodiment, the scalar to scale the frequency count by a factor equal to one when the first circuit is operable to operate in a slow track mode different from the fast track mode.

In one embodiment, the apparatus further comprises: a first digital to analog converter (DAC) to convert a digital representation of the center frequency to an analog representation as the first signal; a PI controller coupled to the logic unit and the first DAC, the PI controller to adjust the digital representation of the center frequency according to the frequency error code.

In one embodiment, the second circuit comprises: an up-down counter operating at a reference clock frequency; a notch logic to cause a notch in an output of the up-down counter; a second digital to analog converter (DAC) coupled to the up-down counter, the second DAC to generate the switching waveform according to the output of the up-down counter. In one embodiment, the apparatus further comprises a pseudo-random generator coupled to the up-down counter, the pseudo-random generator to provide up or down signals to the up-down counter.

In one embodiment, the third circuit comprises: a resistor divider; and a multiplexer to selectively couple an output of the resistor divider to provide the adjustable reference signal. In one embodiment, the apparatus further comprises a fourth circuit coupled to the second circuit and the third circuit, the fourth circuit including: a resistor divider; and a multiplexer to selectively couple an output of the resistor divider to provide the switching waveform.

In another example, a system comprises: a memory unit; and a processor, coupled to the memory unit, having a plurality of integrated voltage regulators (IVR) and a spread-spectrum controller, the spread-spectrum controller including: an oscillator to generate an output clock signal, the oscillator to receive an adjustable reference signal to adjust frequency of the output clock signal; a first circuit to provide a first signal indicative of a center frequency of the output clock signal; a second circuit to generate a switching waveform to provide spread-spectrum for the output clock signal; and a third circuit, coupled to the first and second circuits, to provide the adjustable reference signal according to first signal and the switching waveform.

In one embodiment, the system further comprises: a wireless interface for allowing the processor to communicate with another device; and a display unit. In one embodiment, the second circuit is operable to cause a notch in a spectrum of the output clock signal.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
   an oscillator to generate an output clock signal, the oscillator to receive an adjustable reference signal to adjust frequency of the output clock signal;
   a first circuit to provide a first signal indicative of a center frequency of the output clock signal;
   a second circuit to generate a switching waveform to provide spread-spectrum for the output clock signal; and
   a third circuit, coupled to the first and second circuits, to provide the adjustable reference signal according to the first signal and the switching waveform, wherein the second circuit comprises:
   an up-down counter operating at a reference clock frequency; and
   a first digital to analog converter (DAC) coupled to the up-down counter, the first DAC to generate the switching waveform.

2. The apparatus of claim 1, wherein the oscillator is one of a voltage controlled oscillator (VCO) or a digitally controlled oscillator (DCO).

3. The apparatus of claim 1, wherein the first circuit comprises a second digital to analog converter (DAC) to convert a digital representation of the center frequency to an analog representation as the first signal.

4. The apparatus of claim 1 further comprises a pseudo-random generator coupled to the up-down counter, the pseudo-random generator to provide up or down signals to the up-down counter.

5. The apparatus of claim 1, wherein the up-down counter to generate a triangular waveform for the first DAC.

6. The apparatus of claim 1, wherein the up-down counter to generate a random walk signal for the first DAC.

7. The apparatus of claim 1 further comprises a fourth circuit coupled to the second circuit and the third circuit, the fourth circuit including:
   a resistor divider; and
   a multiplexer to selectively couple an output of the resistor divider to provide the switching waveform.

8. The apparatus of claim 1 further comprises a pulse width modulator (PWM) to receive the output clock signal.

9. The apparatus of claim 1, wherein the oscillator is a replica oscillator of a pulse width modulator (PWM) oscillator.

10. An apparatus comprising:
    an oscillator to generate an output clock signal, the oscillator to receive an adjustable reference signal to adjust frequency of the output clock signal;
    a first circuit to provide a first signal indicative of a center frequency of the output clock signal;
    a second circuit to generate a switching waveform to provide spread-spectrum for the output clock signal; and
    a third circuit, coupled to the first and second circuits, to provide the adjustable reference signal according to the first signal and the switching waveform, wherein the third circuit comprises:
    a resistor divider; and
    a multiplexer to selectively couple an output of the resistor divider to provide the adjustable reference signal.

11. An apparatus comprising:
    an oscillator to generate an output clock signal, the oscillator to receive an adjustable reference signal to adjust frequency of the output clock signal;

a first circuit to provide a first signal indicative of a center frequency of the output clock signal;

a second circuit to generate a switching waveform, the second circuit operable to cause a notch in a spectrum of the output clock signal; and a third circuit, coupled to the first and second circuits, to provide the adjustable reference signal according to the center frequency of the output clock signal and the switching waveform.

12. The apparatus of claim 11, wherein the first circuit comprises:

a frequency counter to count frequency of output clock signal relative to a reference clock signal, the frequency count stored as a frequency code; and a logic unit to subtract the frequency code from a reference frequency code to generate a frequency error code.

13. The apparatus of claim 12, wherein the first circuit further comprises a clock multiplier which is operable to multiply frequency of the output clock signal, the clock multiplier coupled to the frequency counter.

14. The apparatus of claim 13, wherein the clock multiplier is operable to multiply frequency of the output clock signal by a factor greater than one when the first circuit is operable to operate in a fast track mode, and to cause the output clock signal frequency to remain unchanged when the first circuit is operable to operate in a slow track mode different from the fast track mode.

15. The apparatus of claim 12, wherein the first circuit further comprises a frequency scalar to scale the frequency count by a factor greater than one when the first circuit is operable to operate in a fast track mode.

16. The apparatus of claim 15, wherein the scalar to scale the frequency count by a factor equal to one when the first circuit is operable to operate in a slow track mode different from the fast track mode.

17. The apparatus of claim 11 further comprises:

a first digital to analog converter (DAC) to convert a digital representation of the center frequency to an analog representation as the first signal;

a proportional integration (PI) controller coupled to the logic unit and the first DAC, the PI controller to adjust the digital representation of the center frequency according to the frequency error code.

18. The apparatus of claim 11, wherein the second circuit comprises:

an up-down counter operating at a reference clock frequency;

a notch logic to cause a notch in an output of the up-down counter;

a second digital to analog converter (DAC) coupled to the up-down counter, the second DAC to generate the switching waveform according to the output of the up-down counter.

19. The apparatus of claim 18 further comprises a pseudo-random generator coupled to the up-down counter, the pseudo-random generator to provide up or down signals to the up-down counter.

20. The apparatus of claim 11, wherein the third circuit comprises:

a resistor divider; and a multiplexer to selectively couple an output of the resistor divider to provide the adjustable reference signal.

21. The apparatus of claim 11 further comprises a fourth circuit coupled to the second circuit and the third circuit, the fourth circuit including:

a resistor divider; and a multiplexer to selectively couple an output of the resistor divider to provide the switching waveform.

22. A system comprising:

a memory unit; and a processor, coupled to the memory unit, having a plurality of integrated voltage regulators (IVR) and a spread-spectrum controller, the spread-spectrum controller including:

an oscillator to generate an output clock signal, the oscillator to receive an adjustable reference signal to adjust frequency of the output clock signal;

a first circuit to provide a first signal indicative of a center frequency of the output clock signal;

a second circuit to generate a switching waveform to provide spread-spectrum for the output clock signal; and a third circuit, coupled to the first and second circuits, to provide the adjustable reference signal according to first signal and the switching waveform.

23. The system of claim 22 further comprises:

a wireless interface for allowing the processor to communicate with another device; and a display unit.

24. The system of claim 22, wherein the second circuit is operable to cause a notch in a spectrum of the output clock signal.

* * * * *